(12) United States Patent
Liu et al.

(10) Patent No.: US 9,530,930 B2
(45) Date of Patent: Dec. 27, 2016

(54) METHOD OF FABRICATING SEMICONDUCTOR DEVICES

(71) Applicant: NANYANG TECHNOLOGICAL UNIVERSITY, Singapore (SG)

(72) Inventors: Wei Liu, Singapore (SG); Zi-Hui Zhang, Singapore (SG); Zhengang Ju, Singapore (SG); Xueliang Zhang, Singapore (SG); Yun Ji, Singapore (SG); Swee Tiam Tan, Singapore (SG); Xiao Wei Sun, Singapore (SG); Hilmi Volkan Demir, Singapore (SG)

(73) Assignee: NANYANG TECHNOLOGICAL UNIVERSITY, Singapore (SG)

( * ) Notice: Subject to any disclaimer, the term of this patent is extended or adjusted under 35 U.S.C. 154(b) by 0 days.

(21) Appl. No.: 14/762,842

(22) PCT Filed: Dec. 19, 2013

(86) PCT No.: PCT/SG2013/000542
§ 371 (c)(1),
(2) Date: Jul. 23, 2015

(87) PCT Pub. No.: WO2014/120086
PCT Pub. Date: Aug. 7, 2014

(65) Prior Publication Data
US 2015/0325742 A1    Nov. 12, 2015

Related U.S. Application Data (60) Provisional application No. 61/757,931, filed on Jan. 29, 2013, provisional application No. 61/847,295, filed on Jul. 17, 2013.

(51) Int. Cl.
*H01L 33/00* (2010.01)
*H01L 33/62* (2010.01)
(Continued)

(52) U.S. Cl.
CPC ....... *H01L 33/0095* (2013.01); *H01L 33/0079* (2013.01); *H01L 33/62* (2013.01);
(Continued)

(58) Field of Classification Search
None
See application file for complete search history.

(56) References Cited

U.S. PATENT DOCUMENTS 6,071,795 A  6/2000 Cheung et al.
6,627,921 B2  9/2003 Wong et al.
(Continued)

FOREIGN PATENT DOCUMENTS

KR  10-2005-0082040 A  8/2005
KR  10-2007-0018212 A  2/2007

OTHER PUBLICATIONS

Puligadda R. et al., "High-Performance Temporary Adhesives for Wafer Bonding Applications", Material Research Society Symposium Proceeding. vol. 970, p. 0970-Y04-09, 2007.
(Continued)

*Primary Examiner* — Evren Seven
(74) *Attorney, Agent, or Firm* — Sughrue Mion, PLLC (57) ABSTRACT

Vertical high power LEDs are the technological choice for the application of general lighting due to their advantages of high efficiency and capability of handling high power. However, the technologies of vertical LED fabrication reported so far involve the wafer-level metal substrate substitution which may cause large stress due to the mismatch between metal substrate and LED layer. Moreover, the metal substrate has to be diced to separate LED dies which may cause metal contamination and thus increase the leakage current. These factors will lower the yield of LED production and increase the cost as well. The present invention is to disclose a novel method for the fabrication of GaN
(Continued)

vertical high power LEDs and/or a novel method for the fabrication of GaN vertical high power LEDs which is compatible to mass production conditions. The novelty of the invention is that the island metal plating is conducted with the help of pattern formation techniques. Due to the small area of the islands, the stress generated between LED layer and metal islands is much less significant. Furthermore, due to the island metal plating and through the application of temporary supporting carriers the LED dies will be separated at the end of the fabrication process automatically or simply by applying slight mechanical stress or stretching the adhesive tape. This advantage avoids the metal dicing step and reduces the possibility of metal contamination and leakage current generation. Therefore, high yield and low cost will be realized using this novel method in LED production.

11 Claims, 11 Drawing Sheets

(52) U.S. Cl.
CPC .......... *H01L 2933/0016* (2013.01); *H01L 2933/0066* (2013.01)

(56) References Cited

U.S. PATENT DOCUMENTS

| | | | |
|---|---|---|---|
| 6,830,990 B1 * | 12/2004 | Honer | B81C 1/00888 257/E21.599 |
| 7,432,119 B2 | 10/2008 | Doan | |
| 7,488,621 B2 | 2/2009 | Epler et al. | |
| 7,772,020 B2 | 8/2010 | Yoo | |
| 8,106,417 B2 | 1/2012 | Yoo | |
| 2009/0093075 A1 | 4/2009 | Chu et al. | |
| 2013/0249079 A1 * | 9/2013 | Lee | H01L 21/6836 257/737 |

OTHER PUBLICATIONS

Kelly et al., "Optical Process for Liftoff of Group III-Nitride Films", Physica Status Solidi (a) vol. 159, pp. R3-R4 (1997).

* cited by examiner

METHOD OF FABRICATING SEMICONDUCTOR DEVICES

CROSS-REFERENCE TO RELATED APPLICATIONS

This application is a National Stage of International Application No. PCT/SG2013/000542 filed Dec. 19, 2013, claiming priority based on U.S. Provisional Application No. 61/757,931, filed Jan. 29, 2013, and U.S. Provisional Application No. 61/847,295, filed Jul. 17, 2013, the contents of each of which are incorporated herein by reference.

FIELD

This invention relates to method of fabricating semiconductor device's. It is particularly, though not exclusively, applicable to fabrication of vertical LEDs.

BACKGROUND

Semiconductor devices are ubiquitous in modern society and semiconductor manufacturers, for example manufacturers of solid state lighting devices, are constantly seeking to improve the performance of their products.

Recently, devices based on gallium nitride (GaN) have found a wide range of application. In particular, high brightness LEDs based on GaN/InGaN have been widely used, for example in backlighting of LCDs, traffic signals, full color displays and street lights. GaN/InGaN LEDs have also recently started to enter the general lighting market.

In order to be more effective in general lighting applications, the performance of InGaN/GaN LEDs has to be further improved. For instance, it is generally thought that the power conversion efficiency of GaN/InGaN LEDs during high power operation must be greatly increased (to at least 50%) in order for them to replace current fluorescent lamps (power conversion efficiency ~20%) and provide the benefits of better consumer experience and cost effectiveness.

Typically, high power LED devices are grown on a sapphire substrate. Sapphire substrate-based LEDs have certain disadvantages which limit the degree to which their power conversion efficiency can be improved. Due to the electrically insulating nature and poor thermal conductivity (41.9 W/(m·K)) of the substrate, sapphire-based LEDs generally suffer from poor light extraction, poor thermal dissipation, high junction temperature (>100° C.) and large efficiency droop with increasing junction temperature (>40%). These drawbacks provide serious difficulties for further improving the LED efficiency under high power operating conditions.

To attempt to overcome some of those difficulties, the vertical LED concept has previously been proposed. The principle of the proposal is to remove the sapphire substrate and attach the LED to a substitute substrate which has good electrical and thermal conductivities. The substitute substrate serves as an electrode to conduct current, and as an effective heat dissipation path.

Previous methods of fabricating semiconductor devices have implemented a vertical device topology by various means. Typically prior art processes involve the process of final substrate dicing or scribing/cracking. Since in most cases the final substrates are made of metals, the dicing/scribing process may cause metal contamination of the LED devices. This may give rise to leakage current, and may cause device failure or reliability issues. For processes in which the whole LED wafer is attached to a metal final substrate, the mismatch between the LED wafer and the metal substrate may cause large stress generation and wafer bowing after the removal of the original growth substrate, thus potentially giving rise to device failure and reliability issues.

There may be a need for a method of fabricating semiconductor devices which can alleviate one or more of the above-mentioned difficulties, or at least provide a useful alternative.

SUMMARY

In general terms, the present invention proposes methods of fabricating semiconductor devices without dicing or scribing.

According to a first specific expression of the invention, there is provided a method of fabricating semiconductor devices, the method comprising:
  providing a device layer on a substrate, the device layer comprising a semiconductor material;
  masking a portion of the device layer or the substrate;
  depositing a conductive material on an unmasked portion to form a plurality of conductive substrates on the device layer, each conductive substrate being in electrical contact with a respective portion of the device layer; and
  separating the device layer into a plurality of semiconductor devices, wherein the separation is substantially within the masked portion.

According to a second specific expression of the invention, there is provided a method of fabricating vertical LEDs, comprising:
  providing an LED wafer;
  defining dies on the wafer using a thick patterning structure with a thickness in the range 10 μm to 500 μm;
  depositing metal islands at die level on the wafer using the patterning structure; and
  separating the dies automatically or by applying a slight mechanical force on the wafer.

BRIEF DESCRIPTION OF THE DRAWINGS

Embodiments of the invention will now be described, by way of non-limiting example only, with reference to the accompanying drawings in which.

DETAILED DESCRIPTION

Embodiments are described with reference to their application to fabrication of vertical LEDs. However, it will be appreciated that the methods described below can be used (with any required adaptations being straightforward for the skilled person) for fabrication of many types of semiconductor device, including but not limited to: optoelectronic devices such as high power LEDs, photodetectors, laser diodes; and microelectronic devices such as bipolar transistors.

Figure 1:
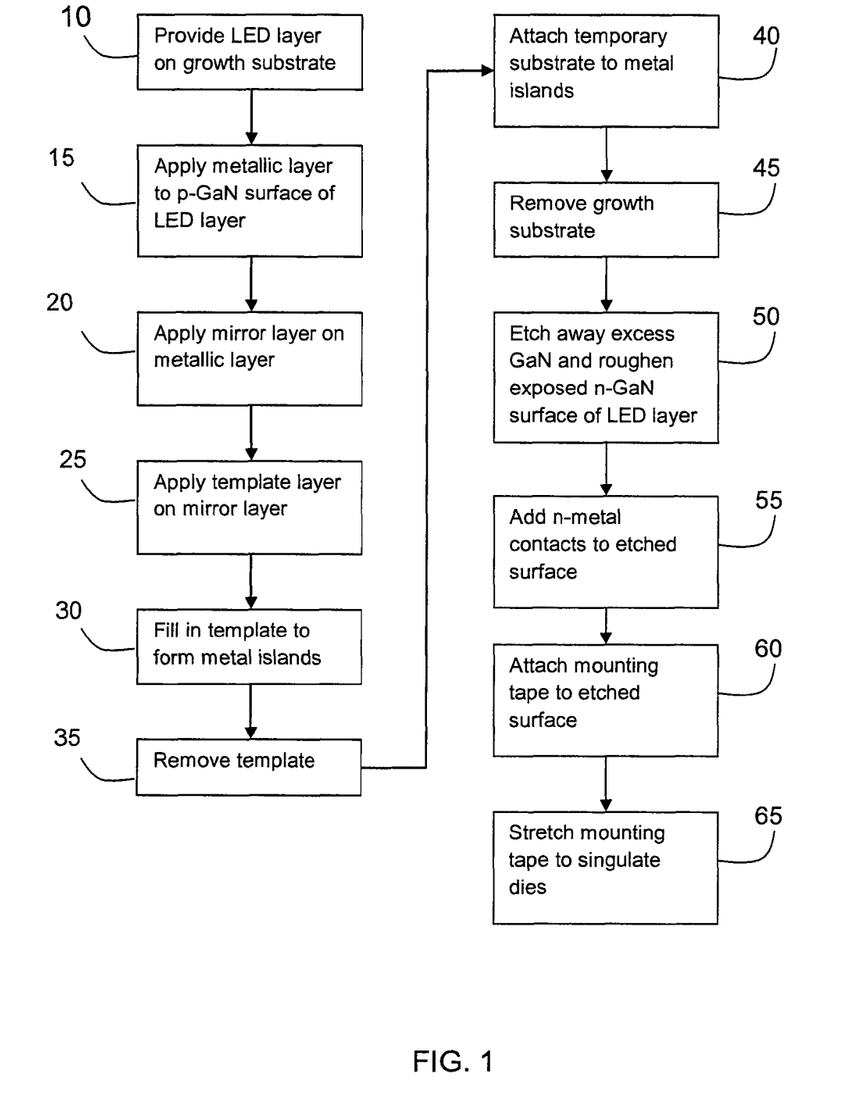
FIG. 1 is a flow chart of a semiconductor fabrication process according to a first embodiment.
Figure 2:
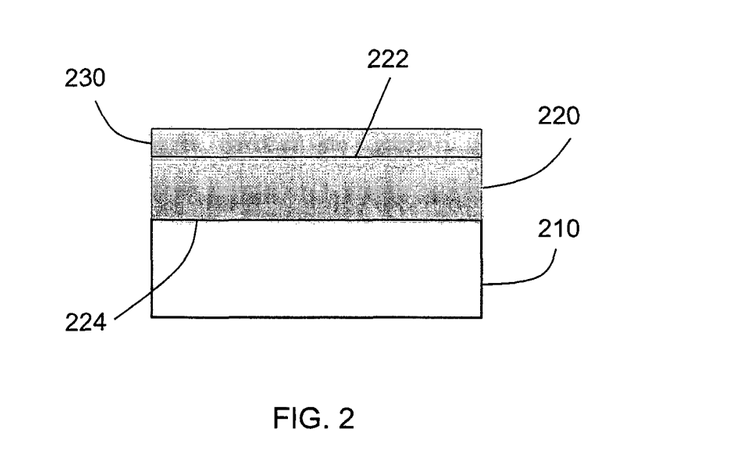
FIGS. 2 to 11 show a layered semiconductor-containing structure at various stages during the process of FIG. 1.

Referring to FIGS. 1 to 11, a first embodiment of a semiconductor fabrication process comprises providing an LED layer 220 on a growth substrate 210 (step 10), as shown in the cross-sectional view of FIG. 2. The LED layer 220 comprises a layer of a p-type material, a layer of an n-type material, and an active light-emitting layer between the n-type and p-type layers. In one example, the p-type material is p-GaN, the n-type material is n-GaN, and the active layer comprises an InGaN/GaN multiple quantum well. In the following discussion it will be convenient to refer to the process of FIG. 1 as applied to this exemplary configuration. It will be appreciated, however, that the process has general application regardless of the precise nature of the materials of LED layer 220. The growth substrate 210 will typically be sapphire, and LED layer 220 may be grown epitaxially on the sapphire substrate 210 in a manner known in the art.

As shown in FIG. 2, LED layer 220 is disposed on the substrate 210 such that n-GaN surface 224 faces the substrate 210 and p-GaN surface 222 faces away from it. In other embodiments, the LED layer 220 may be grown on substrate 210 with the opposite orientation, i.e. with p-GaN surface 222 facing substrate 210.

At step 15, a metallic layer 230 is applied to the p-GaN surface 222 of LED layer 220. Metallic layer 230 acts as an ohmic contact layer. The p-GaN surface 222 of LED layer 220 may be pre-cleaned using organic solvents and/or acids before the metal contact layer 230 is deposited. The metal contact layer 230 may include Ni/Au, Ni/Ag, Pt, Pd, W, Mo, Ta, TaN, a refractory metal, a metal alloy, ITO or any other suitable metals, or a composite of these materials. The thickness of the metal contact layer 230 is typically in the range from about 3 nm to about 20 nm.

The deposition of the metal contact layer 230 can be performed using a number of deposition methods, including but not limited to: electron beam deposition, sputtering, physical vapour deposition (PVD), chemical vapour deposition (CVD), plasma-enhanced CVD (PECVD), ion beam deposition, or electro-chemical deposition.

In some embodiments, the metal contact layer 230 may be subjected to annealing at a temperature ranging from about 400° C. to 700° C. The annealing may be conducted in $N_2$ ambient, in $N_2/O_2$ ambient, or in air. The annealing can be carried out for a time in the range from about 1 minute to about 10 minutes.

Figure 3:
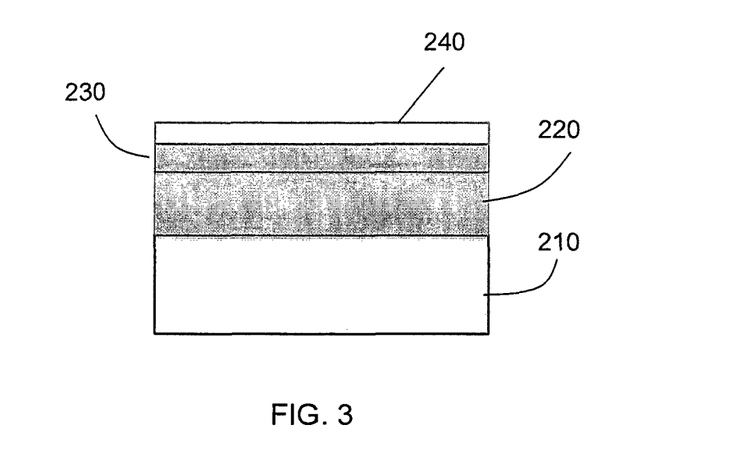

At step 20, a mirror layer 240 is deposited on top of the metal contact layer 230 (FIG. 3). The mirror layer 240 acts to increase the light output by the LED, and preferably has a reflectance of 90% or more. The mirror layer 240 may comprise a metal selected from the group consisting of Al, Ag, Ti, Pt, Cr, and Pd. The thickness of the mirror layer 240 is typically in the range from about 50 nm to about 200 nm.

In some embodiments, a seed metal layer (not shown) may be deposited onto the mirror layer 240. The seed layer is useful to enhance the strength of adhesion to a subsequently deposited metal layer, for example. The seed layer materials may be selected from the group consisting of Ni, W, Au, and TaN. The thickness of the seed layer may be in the range from about 10 nm to about 10 um. Advantageously, the seed layer may be made relatively thick to ensure reliable bonding between the mirror layer and the subsequently deposited metal layer, or if no mirror layer is present, between the contact layer and a subsequently deposited metal layer. In this regard, preferred thicknesses are in the range from about 1 um to about 10 um.

The mirror layer 240 and the seed layer (if present) can be deposited using a variety of different deposition methods, including but not limited to: electron beam deposition, sputtering, physical vapour deposition (PVD), chemical vapour deposition (CVD), plasma-enhanced CVD (PECVD), ion beam deposition, or electro-chemical deposition.

LED layer 220, contact layer 230 and mirror layer 240 can collectively be termed a device layer, since they will form part of the final LED devices once processing is complete. The device layer, as referred to herein, may also include other components such as additional contact layers.

Figure 4:
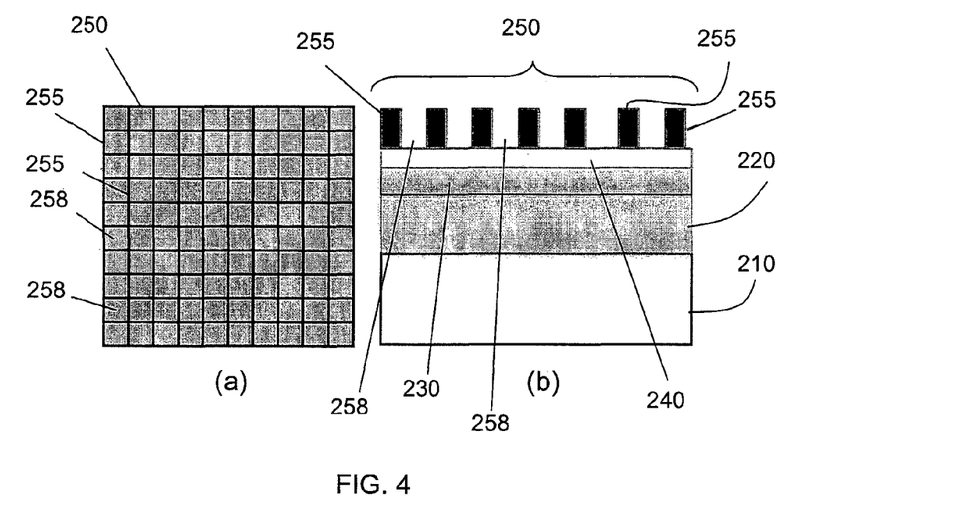

At step 25, a patterning structure 250 is applied to mirror layer 240 (FIG. 4(b)). The patterning structure 250 comprises a series of walls 255 laid out in a grid pattern, as best shown in the top plan view of FIG. 4(a). The walls 255 define partitions 258, each of which is aligned with and overlies a portion of the LED layer 220. The positions of walls 255 coincide with the boundaries between LED dies as will later be described. Accordingly, the patterning structure 250 comprises a series of partitions or voids 258 separated by walls 255, the partitions or voids 258 being laid out in a desired pattern according to which material is to be deposited on the device layer.

Patterning structure 250 preferably comprises an electrically insulating material, and in certain embodiments, can be applied using photolithography. In one example, a layer of photoresist is spin-coated onto the surface of the mirror layer 240. The photoresist layer thickness may be in the range from about 10 μm to about 500 μm. Following spin coating, the photoresist is exposed through a mask such that regions of the photoresist corresponding to partitions 258 can be removed, leaving sidewalls 255 of patterning structure 250.

Other methods of applying the patterning structure 250 are also possible. For example, a layer of material may be applied, and then selectively removed by masked etching or imprinting. Exemplary imprinting methods include hot embossing methods, in which a mould carrying the inverse of the desired pattern is heated and pressed into a polymer layer (applied by spin coating, for example), or soft embossing (e.g., UV embossing) methods in which a mould is pressed into a radiation-curable material (e.g., an oligomer or polymer precursor) while the material is soft, and the radiation-curable material then cured with the mould in place to produce the desired structure. In some examples a transparent mould may be used, and the curing performed through the transparent mould.

In other embodiments, the sidewalls 255 may be applied directly by deposition of material through a mask.

In yet further embodiments, the patterning structure 250 may be prefabricated with the desired pattern, and then releasably secured or otherwise applied to the mirror layer 240.

In certain embodiments, the partitions 258 are square in top plan view, and may have a width in the range between about 100 μm and 2 mm. A wide variety of other top plan view shapes, for example rectangles, triangles, hexagons or circles, are also possible depending on the shape which is desired for the final substrate for the LED dies.

Figure 5:
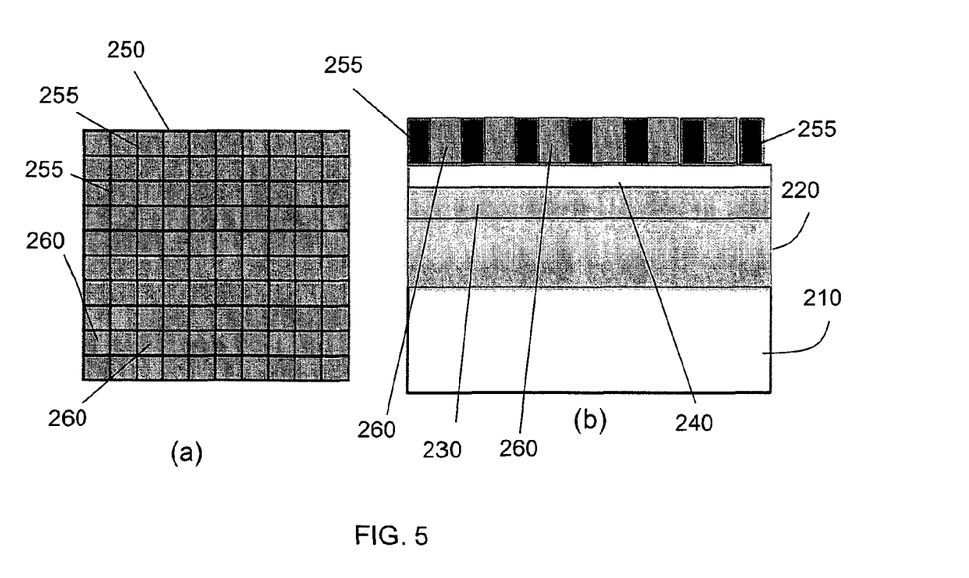

After the application of the patterning structure 250, the partitions 258 are filled in (step 130) by deposition of a metallic material (step 30). Following the metal layer deposition, islands 260 of metal are formed on the device layer, specifically on mirror layer 240. The metal islands 260, when the LED dies are separated from each other, form conductive substrates for the respective LED dies. Each metal island 260 serves as an electrode as well as a heat sink. Accordingly, the metal islands 260 should preferably have both excellent thermal conductivity and excellent electrical conductivity. Copper, silver and other metals possessing these properties can be used to form the metal islands 260. For example, copper electroplating can be used to plate copper into the partitions 258. It will be appreciated that the metal islands 260 can also be deposited using other metal deposition methods such as electron beam evaporation, thermal evaporation, PVD, CVD sputtering deposition, etc. The thickness of the metal layer used to form the islands 260 may be in the range between about 10 μm and 500 μm.

Figure 6:
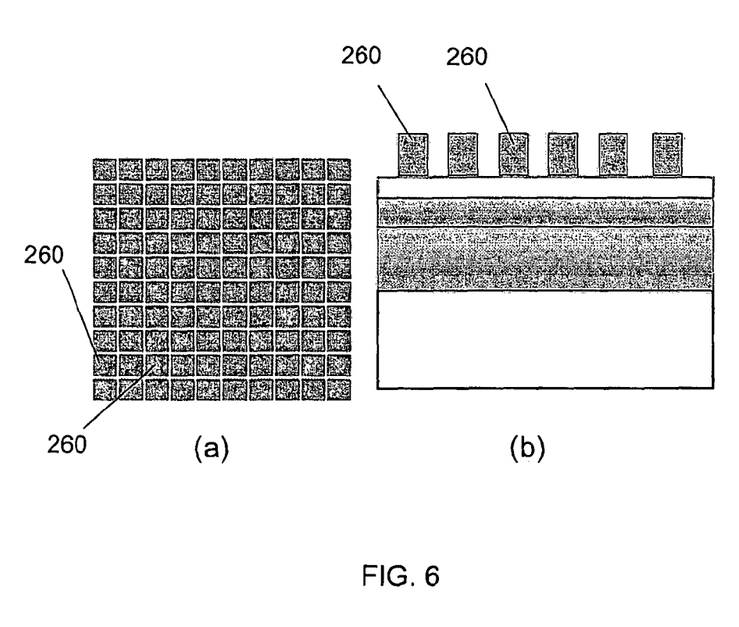

After the metal island plating 130, the patterning structure 250 can be removed (step 35) to leave the metal islands 260, as shown in the top plan view of FIG. 6(*a*) and the cross-sectional view of FIG. 6(*b*).

Figure 7:
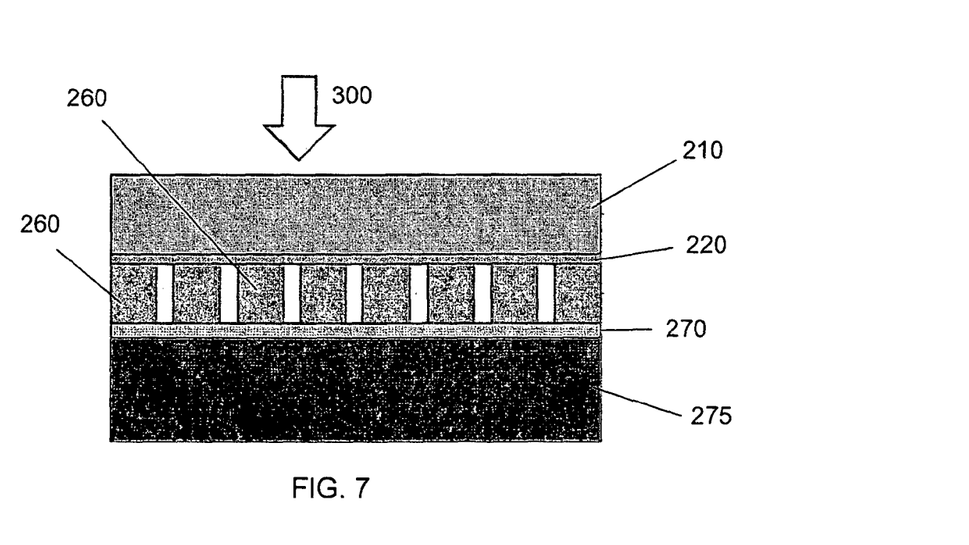

At step 40 the semiconductor-containing structure is bonded to a temporary supporting carrier 275 using temporary bonding adhesive 270 as shown in FIG. 7. The temporary supporting carrier 275 acts as a supporting structure when the original sapphire substrate 210 is removed. The temporary supporting carrier 275 can be any suitable material which provides the necessary mechanical support for the device layer. Particular examples of suitable materials are Si, quartz, glass, and sapphire. The bonding adhesive 270 should be strong enough to bond the device layer to the temporary substrate 275, and should also be readily removable at completion of the process. In certain embodiments the adhesive 270 can be a low melting temperature adhesive, for example a low melting point metal, and the temporary substrate 275 can be removed by heating. The temporary substrate 275 may alternatively be removed by exposing adhesive 270 to a suitable solvent, for example.

At step 45, the sapphire substrate 210 is removed. A preferred removal method is UV laser liftoff, in which the LED layer 220 is irradiated with a UV laser 300 from the substrate side (since the sapphire substrate 210 is UV-transparent). In preferred embodiments, the entire LED layer 220 is irradiated in order to remove the substrate 210, for example by scanning across the wafer as described below.

Laser liftoff relies on the fact that at sufficiently high temperatures, the stability of GaN is limited by the decomposition of the crystal into nitrogen gas and liquid gallium: 2GaN (s)→N2 (g)+2Ga (1). The flux of nitrogen molecules leaving the crystal surface in vacuum exponentially increases with temperature when the temperature exceeds the critical sublimation temperature of 830° C. The decomposition rate reaches approximately one monolayer per second at a temperature of 930° C. Thus, GaN can be removed very efficiently via thermal decomposition by methods which enable a controlled local heating of the sample to temperatures above 900° C.

One way to locally decompose GaN is by absorption of intense light with photon energies above the bandgap of GaN (3.42 eV), e.g. the 355 nm (3.49 eV) third harmonic of a Nd:YAG pulsed laser with a pulse width of t=6 ns, or the 248 nm (4.99 eV) line of a KrF excimer laser with a pulse width of t=38 ns. Because of the much longer pulse duration in the case of the KrF laser, a higher pulse energy of typically 600 mJ/cm$^2$ is necessary to heat the GaN above the sublimation threshold, whereas pulse energies of 300 mJ/cm$^2$ are sufficient in the case of the Nd:YAG laser, as disclosed in U.S. Pat. No. 6,071,795 (Cheung et al); Kelly et al. (1997), "Optical Process for Liftoff of Group III-Nitride Films", *Physica Status Solidi* (*a*) Vol. 159, pp. R3-R4; and Wong et al., "Ubiquitous Blue LEDs: The Integration of GaN Thin Films with Dissimilar Substrate Materials by Wafer Bonding and Laser Lift-off", *Compound Semiconductor*, November/December 1999, pp. 54-56; the contents of each of which are incorporated herein by reference.

In certain embodiments, a high power UV laser beam is patterned into a 3 mm by 3 mm square beam using a beam homogenizer. The beam homogenizer converts a Gaussian-like laser beam to a flat plateau-like laser beam which provides improved beam uniformity. Large areas may be exposed by scanning the laser beam across the whole wafer. The laser output power can be varied using attenuators. The UV laser is typically pulsed in the range of 1~10 Hz with one pulse typically being sufficient to achieve decomposition of the GaN layer. The patterned laser beam 300 is directed onto the LED layer 220 through the sapphire substrate 210 side and is scanned across the whole wafer 220. When the laser power density is larger than a critical value, the GaN layer near the interface of sapphire/GaN will be decomposed into Ga metal and nitrogen. The sapphire substrate 210 can be removed directly, or after heating the wafer to 40° C. or more. The nitrogen is automatically released into the ambient. The Ga metal may be removed using hydrochloric acid.

Figure 8:
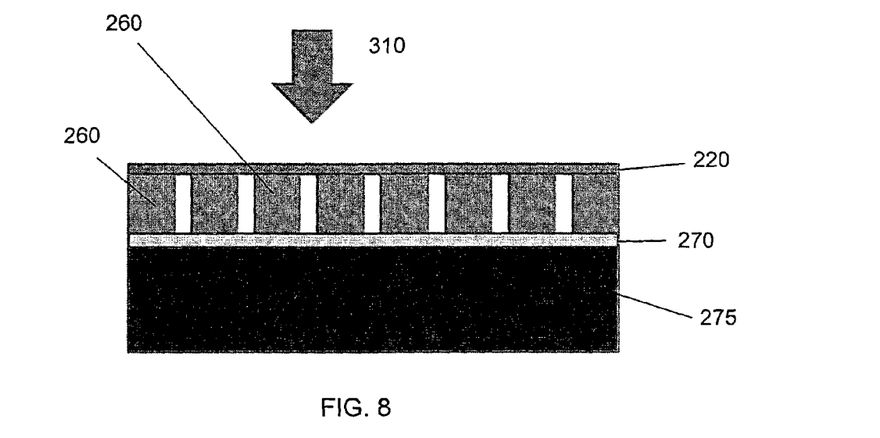

Once the sapphire substrate 210 is removed, the exposed GaN layers of LED layer 220 will typically comprise buffer and coalescence layers. These are generally unintentionally doped and of low crystal quality and should be removed (step 50), for example by a dry etching technique such as ICP or RIE 310 as shown in FIG. 8. Optionally, before the dry etching, the side walls of the device layer may be protected by passivation with a material such as SiO$_2$, SiN, or photoresist. The GaN may be removed to a predetermined depth, typically of the order of 2 μm~4 μm. Once the desired amount of excess GaN has been removed, n-type GaN is exposed. In order to improve the light extraction efficiency, the exposed n-GaN surface may be roughened, for example by a patterning technique such as nanoimprinting or nanosphere lithography. The pattern can be in a variety of shapes, for example cones, pyramids, pillars, and domes. The patterned elements may have pitch, diameter and height each in the range between about 100 nm and about 5 μm.

Figure 9:
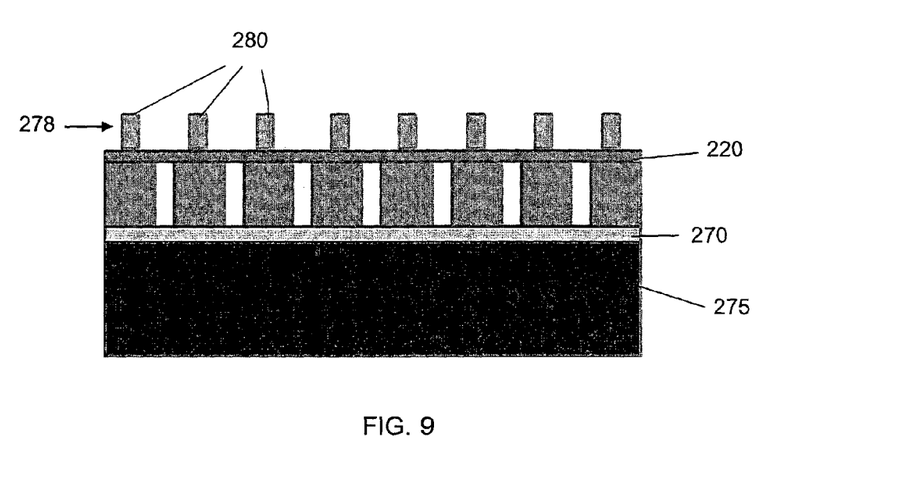

At step 55, after the patterning of the n-GaN surface 224, an n-metal contact layer 278 comprising contacts 280 is deposited on the patterned surface of LED layer 220 as shown in FIG. 9. The contacts 280 can have various layouts, for example dots, cross lines, a lattice or grid of lines, inter-digitated fingers, etc. The layout is preferably chosen in order to optimally spread the current whilst minimising blocking and/or absorption or light by the metal contact layer 278. The metal contact layer 278 can be made of various conductive materials, including but not limited to: Ti/Al, Cr, Ti/Au, ITO, or other metals or conductive metal oxides.

Figure 10:
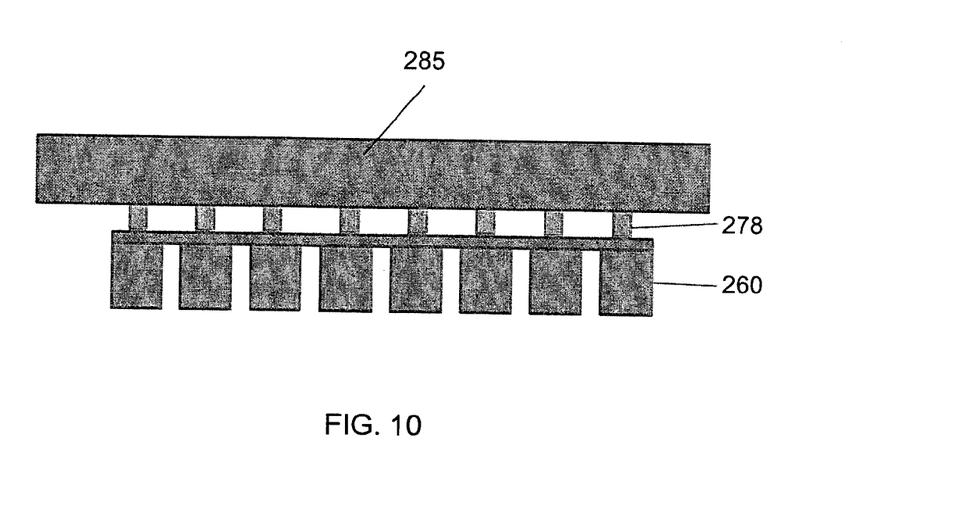

The metal contact layer 278 can be deposited by various methods including electron beam deposition, sputtering, physical vapour deposition (PVD), chemical vapour deposition (CVD), plasma-enhanced CVD (PECVD), ion beam deposition, or electro-chemical deposition. The metal contact layer 278 may be subjected to annealing at temperatures from about 500° C. to about 600° C. in N$_2$ ambient for about 5 to 10 minutes. At step 60 a mounting tape in the form of stretchable adhesive tape 285 is affixed to n-metal contact layer 278 as shown in FIG. 10. The adhesive tape 285 preferably has moderate adhesiveness, high flexibility and stretchability, and is preferably resistant to acid and base erosion. As shown in FIG. 10, the temporary supporting carrier 275 and temporary bonding adhesive 270 are also removed at this point, for example by exposing the adhesive 270 to a suitable solvent.

Figure 11:
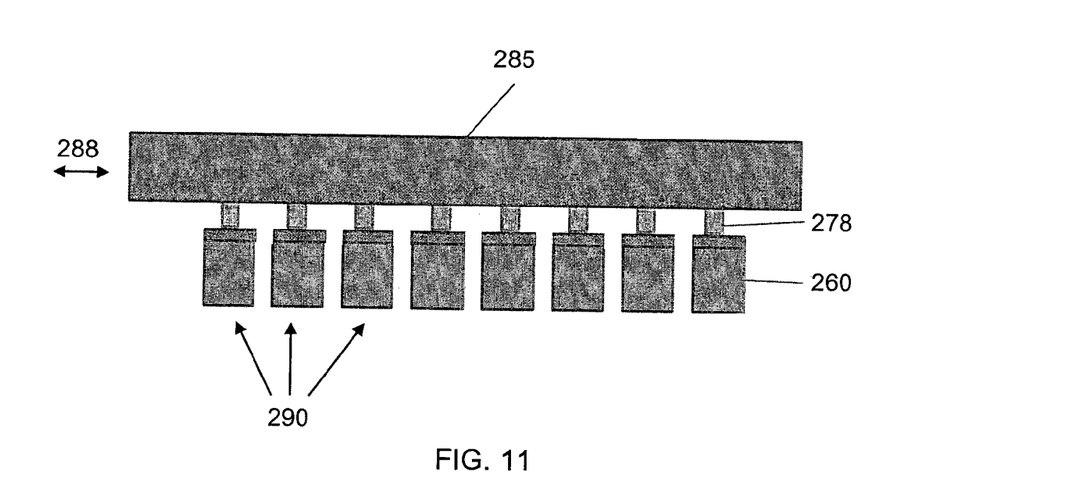
Figure 12:
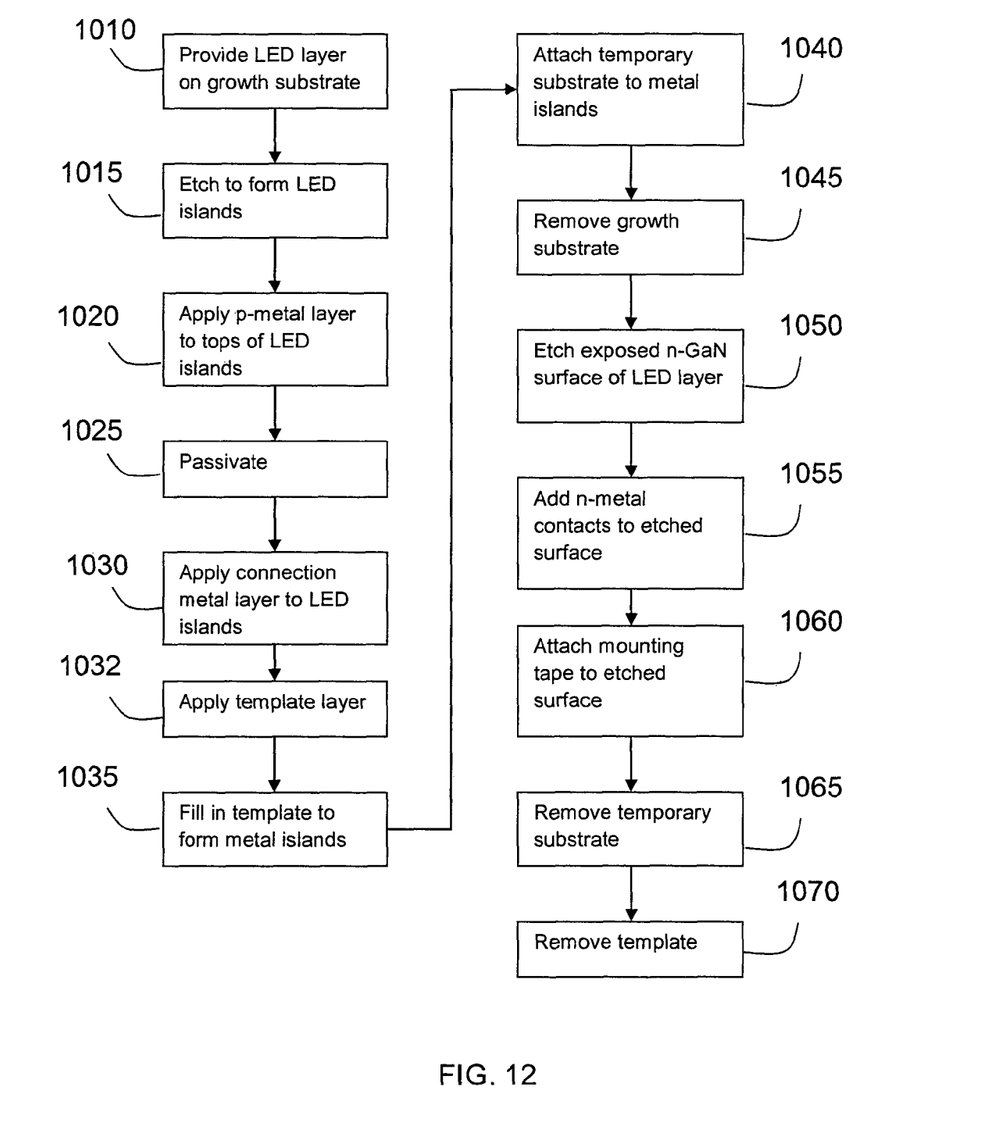
FIG. 12 is a flow chart of a semiconductor fabrication process according to a second embodiment.

At step 65, the LED dies are separated from each other, for example by stretching the mounting tape in direction 288 as shown in FIG. 11, to form LED dies 290 each having a metal substrate 260. Alternatively, the dies 290 can be separated by applying mechanical pressure on the LED wafer.

Figure 13:
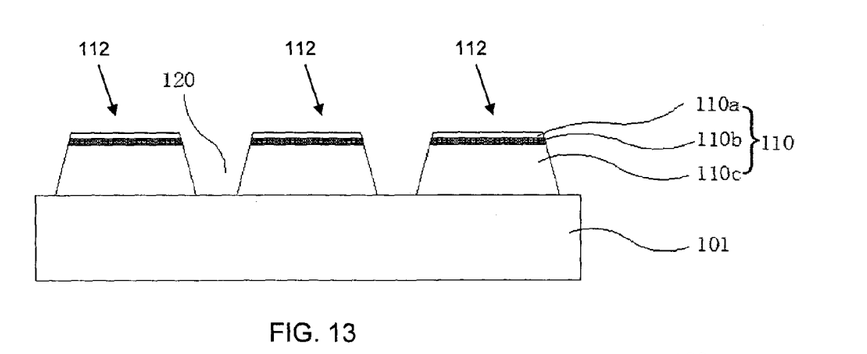
FIGS. 13 to 23 show a layered semiconductor-containing structure at various stages during the process of FIG. 12.

Referring now to FIGS. 12 to 23, in another embodiment processing may be performed on a device layer comprising individual LED dies provided on a substrate 101, separated by trench regions 120. The trench regions 120 may be formed by etching into a single contiguous epitaxial layer 110 (comprising n-GaN layer 110c, active layer 110b and p-GaN layer 110a) which is provided on the substrate 101 (step 1010). The epitaxial layer 110 is etched, at step 1015, to a depth sufficient to reach the substrate 101, such that LED islands 112 are formed (FIG. 13). Preferably, the islands 112 have angled side walls. Advantageously, angled side walls enable extraction of more light from the device and improve the device efficiency.

Figure 14:
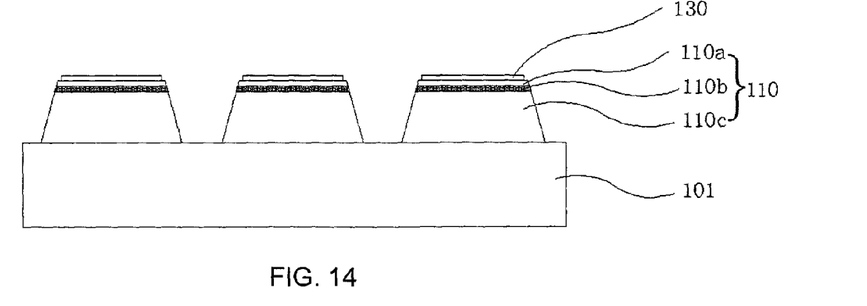

At step 1020, a p-electrode layer 130 is applied to the surface of p-doped layer 110a of each LED island 112, as shown in FIG. 14. The p-electrode 130 acts as a light reflector, current conductor, and ohmic contact with the p-doped layer 110a. Thus, the p-electrode 130 preferably comprises a transparent conducting layer, a reflective layer, and a conductive supporting layer.

The transparent conducting layer forms an ohmic contact with p-doped layer 110a, and is preferably formed from a transparent conductive oxide such as indium-tin-oxide (ITO), or is a semi-transparent metal thin film comprising Pd, Ni, Cr, Al, or Ag.

The reflective layer is formed on the transparent conducting layer and may comprise Al or Ag, for example.

Figure 16:
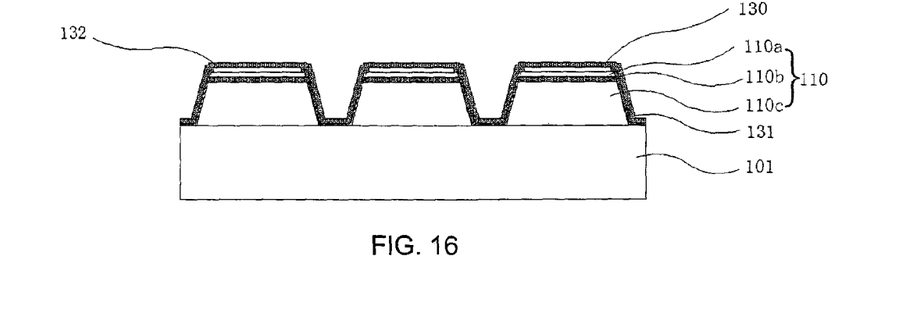

The conductive supporting layer may be formed from Pt, Ni, Pd, Ag, Ti, Al, Au, W, Cr, Cu, or the like, and is formed on the reflective layer. The conductive supporting layer acts as a supporting layer to protect the reflective layer and also acts as a connection layer between the p-electrode 130 and a seed layer (connection metal layer) 132 (FIG. 16). Generally, it is preferred that the p-electrode 130 be patterned so that the edge of the p-doped layer 110a will not be covered by the p-electrode. This can help to greatly reduce the leakage current and improve the device reliability. A gap may be left around the edge of the p-electrode 130 such that it does not reach the edge of p-doped layer 110a.

Figure 15:
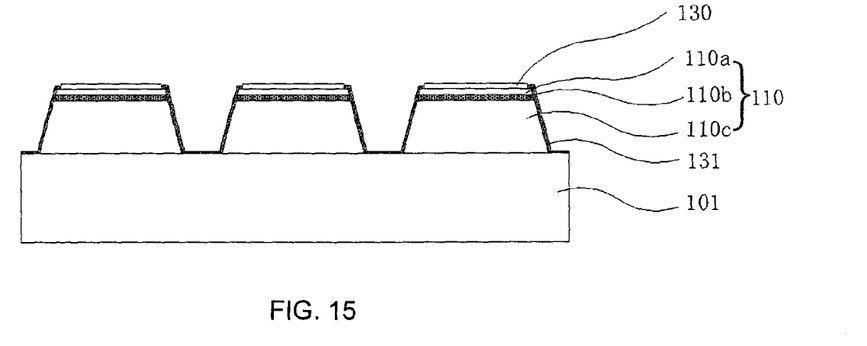

At step 1025, a passivation layer 131 is applied to the surfaces of LED islands 112, in order to protect each island 112 as shown in FIG. 15. The passivation layer 131 separates the n-doped layer 110c from the p-doped layer 110a so as to prevent current leakage. The material used for the passivation layer 131 may be an insulative inorganic material such as silicon oxide ($SiO_x$) or silicon nitride ($SiN_x$), or photoresist such as SU-8.

After the passivation layer 131 is applied, the p-electrode 130 may be partly covered by the passivation layer 131. In other embodiments, the edge of passivation layer 131 only reaches the p-doped layer 110a and does not obscure the p-electrode 130.

At step 1030, a connection metal layer 132 is formed on the upper surfaces of LED islands 112 as shown in FIG. 16. The p-electrode 130 and the passivation layer 131 may be entirely or partly covered by the connection metal layer 132 for preparation for metal plating or wafer bonding. Connection metal layer 132 may be formed from a metal selected from the group Ti, Cu, Au, Ni, Ag, Sn, and In, or a combination of two or more such metals. The connection metal layer 132 is used as a supporting or adhesion layer in subsequent processing.

Figure 17:
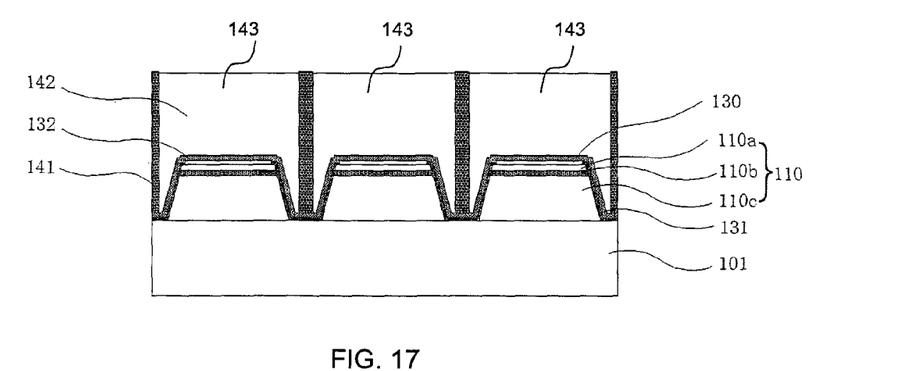

At step 1032 a patterning structure 141 is formed on the connection metal layer 132 as shown in FIG. 17. The patterning structure 141 is used to partition the device layer into individual LED die regions, each region containing one of the LED islands 112. Patterning structure 141 comprises a series of side walls, similar to the grid structure shown in FIG. 4(a), and is formed such that the side walls are within trenches 120. Patterning structure 141 may be applied by photolithography, as described above for example.

The patterning structure 141 is applied such that the sidewalls are high enough for metal plating to be performed. The patterning structure 141 typically has a height in the range between about 50 µm and about 200 µm, depending on the thickness of metal plating layer 142 which is to be applied.

At step 1035, metal plating 142 is selectively formed on the device layer by electroplating into the voids defined by the sidewalls of patterning structure 141. Due to the partitioning provided by the patterning structure 141, once electroplating has been completed a series of metal islands 143 is formed on the device layer, each metal island being in electrical contact with one of the LED islands 112. The metal plating layer 142 may comprise copper, nickel, silver or the like. As before, the metal islands 143, when the LED dies are separated from each other, form conductive substrates for the respective LED dies and serve as electrodes as well as heat sinks. Also as before, the metal islands 143 can be deposited using other metal deposition methods such as electron beam evaporation, thermal evaporation, PVD, CVD sputtering deposition, etc.

Figure 18:
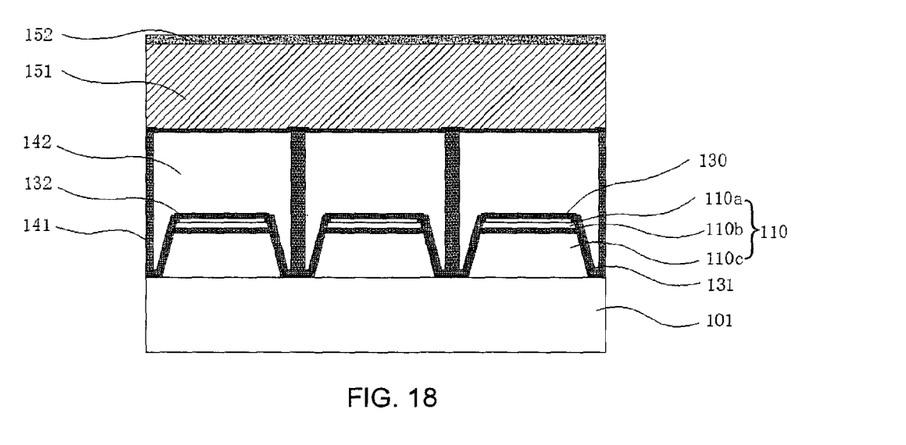

Next, as shown in FIG. 18, a flexible temporary supporting carrier 151 is formed on the surface of metal plating layer 142 (step 1040). Optionally, the patterning structure 141 may be removed prior to applying the temporary carrier 151. The flexible temporary supporting carrier 151 may comprise photoresist, resin, an organic film or the like, and is preferably applied by spin coating or adhesion. The flexible temporary supporting carrier 151 is preferably selected so as to be soluble in a particular solvent, such as water, which will not significantly react with adhesives used in the rest of the process. An additional material having similar solubility in the particular solvent may be added for better adhesion between the flexible temporary supporting carrier 151 and the metal plating layer 142.

A protection layer 152, for example a film comprising a resin, photoresist or a metal, may be formed on the flexible temporary supporting carrier 151 for protection and support. The protection layer 152 can be used as a support during a subsequent surface texturing process, if the flexible temporary supporting carrier 151 might not survive the texturing process. Alternatively, or in addition, a semiconductor wafer or glass can be formed on the backside of the device (i.e., on the same side as carrier 151) for protection and support.

Figure 19:
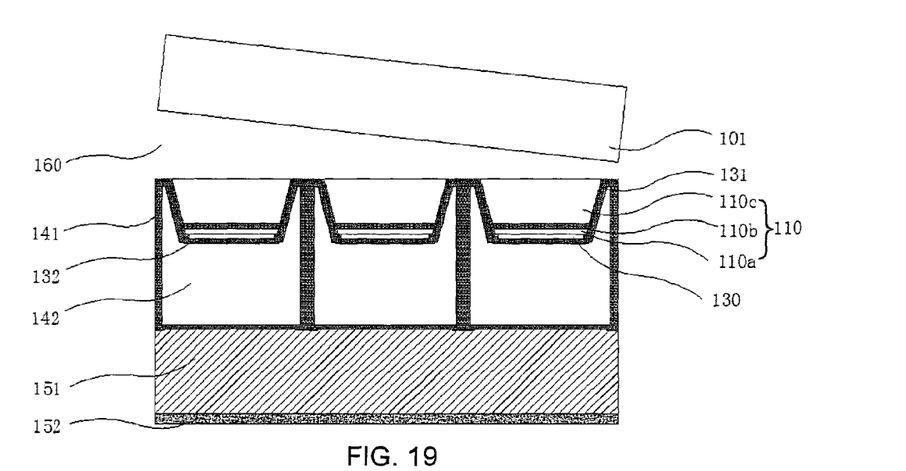

At step 1045 the growth substrate 101 is removed by a chemical or mechanical method 160 as shown in FIG. 19, to expose n-GaN layer 110c of respective LED islands 112. During removal, the metal plating layer 142, flexible temporary supporting carrier 151, and protection layer 152 collectively act as a supporting layer. The substrate removing process 160 can be laser lift-off (LLO), chemical lift-off, etching, mechanical lapping or the like.

Figure 20:
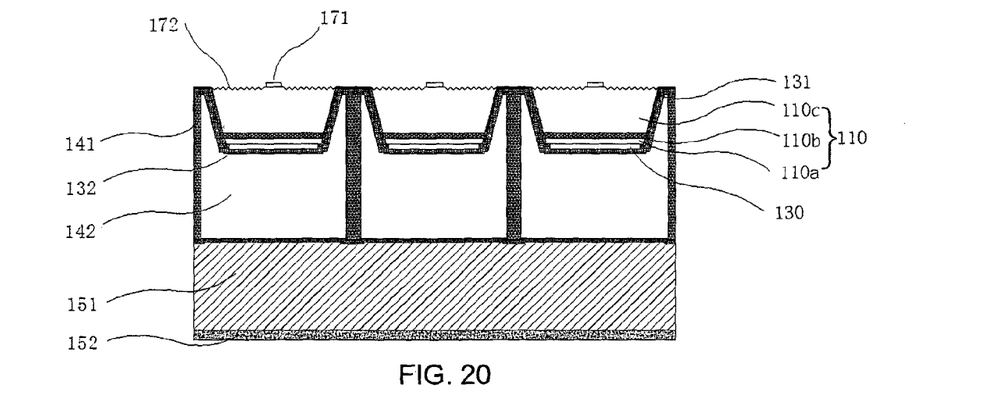

At step 1055 an n-electrode layer 171 is formed on the exposed surface of n-GaN layer 110c, as shown in FIG. 20. The exposed surface may be rinsed and partially etched (step 1050) for better contact and current spreading. The n-electrode layer 171 may have ohmic contact with n-doped layer 110c. Preferably, texturing of the exposed n-GaN surface (i.e., that portion not obscured by n-contact 171) is performed to produce surface texture 172 in order to improve light extraction efficiency. The surface texturing process 172 may be carried out by wet etching or dry etching, and the pattern can be regular or irregular. Other methods of texturing the surface, such as nanoimprinting or nanosphere lithography, can also be employed. The n-electrode layer 171 may be protected to avoid it being damaged during the surface texturing process.

Figure 21:
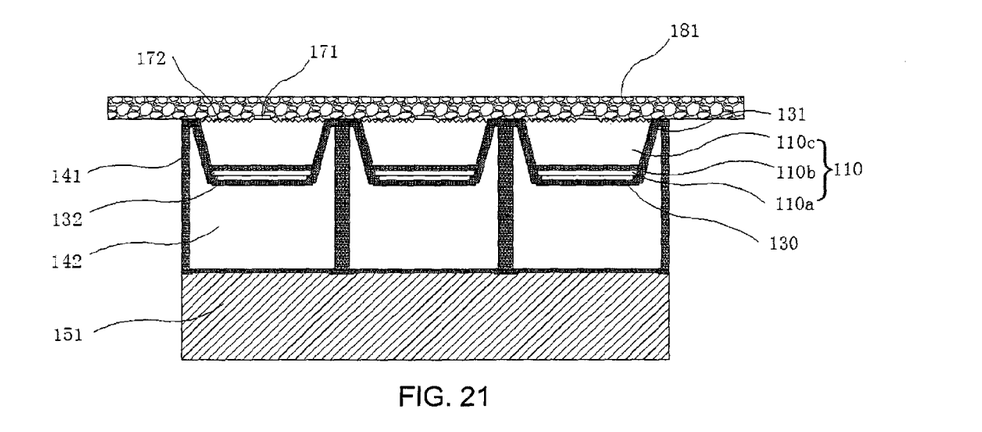

At step 1060, the device is transferred from the temporary supporting carrier 151 to a mounting tape in the form of adhesive tape 181 (FIG. 21). Before the adhesive tape 181 is adhered, the protection layer 152 is removed. The protection layer 152 may be removed chemically, e.g. using an organic solvent, or mechanically, e.g. by peeling. It is preferred that the protection layer 152 be removed before applying the adhesive tape 181 because the solvent used in a chemical removal process may dissolve the adhesive tape, or the rigidity and hardness of the protection layer 152 may cause damage to the adhesive tape if a mechanical process such as peeling is used.

Figure 22:
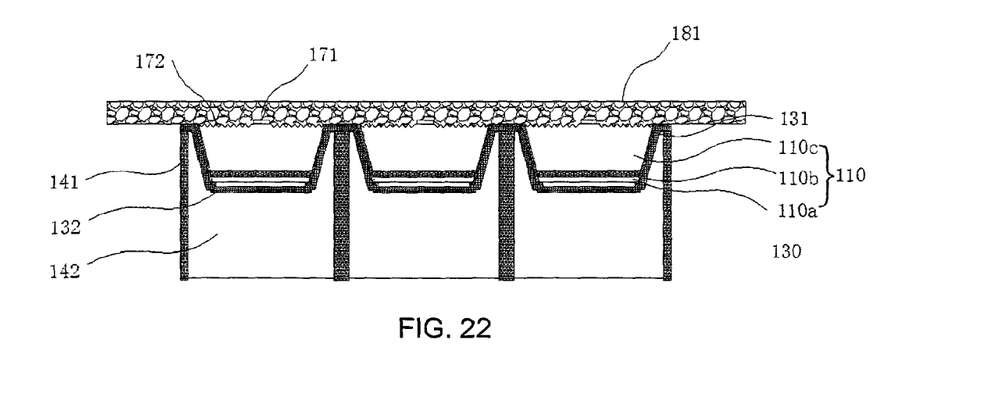

At step 1065 the flexible temporary supporting carrier 151 is removed. As mentioned above, the flexible temporary supporting carrier 151 is soluble in a solvent which does not damage the adhesive tape 181. Removal of the temporary carrier 151 essentially automatically separates the individual LED dies, each of which comprises LED island 112, p-contact 132, n-electrode 171, and conductive (metal island) substrate 143, with the adhesive tape 181 being a substrate on which the LED dies are disposed as shown in FIG. 22.

Figure 23:
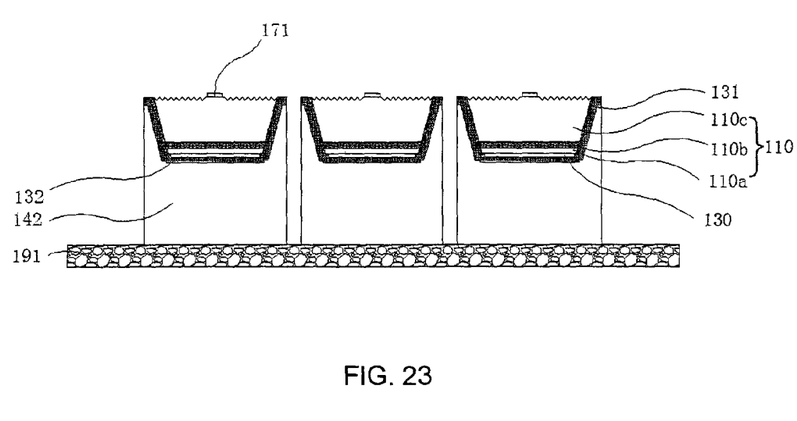

In order to make n-electrodes 171 upward facing for die sorting, the LED devices may be attached to a second adhesive tape 191, prior to removal of the first adhesive tape 181 (FIG. 23). If the patterning structure 141 was not previously removed, it advantageously provides better connection and support to the individual devices during the transfer, and can be removed following the transfer (step 1070).

Embodiments may have one or more of the following advantages:

Improved Light Extraction Efficiency

In certain embodiments, after the original sapphire substrate is removed, the exposed GaN surface is roughened or patterned, thereby enhancing light extraction efficiency. A highly reflective mirror may be applied between the LED layer and the metal substrate, also helping to enhance the light extraction efficiency.

Effective Heat Dissipation

The original sapphire substrate is a poor thermal conductor (thermal conductivity of 41.9 W/(m·K)) and the LEDs can consequently suffer from serious, efficiency droop due to the junction temperature increase caused by the large heat resistance of the sapphire substrate. By using a metal substrate with high thermal conductivity, such as copper (thermal conductivity of 401 W/(m·K)), the heat generated by the LEDs can be effectively dissipated and efficiency droop can be avoided.

Improved Yield and Reliability

In previously known fabrication processes, it has been necessary to apply whole wafer-level metal substrate deposition and metal substrate dicing processes. Stress and bowing are consequently generated in the LED wafer, causing cracks and damages in LED films after removing the original sapphire substrate. This will potentially result in failure of LEDs, and lower yield and reliability. In addition, during metal substrate dicing, it is common for metal particles to be generated. Metal particles are serious contaminants for LED devices and can cause current leakage and short-circuit issues. The mechanical shock imparted to the wafer during the dicing process may also cause damage to LEDs. Together these factors will lower the yield and cause reliability issues.

On the contrary, embodiments of the presently disclosed processes involve deposition of metal islands, i.e. the metal substrate is formed at the die level and not at whole-wafer level. This effectively suppresses the generation of stress and bow. In addition, because dies can be separated from the wafer without dicing, this avoids the metal particle contamination problem. Accordingly, yield and reliability can be greatly improved.

Cost Effective and Material/Process Efficient

In the prior art, in order to dice the wafer, a significant fraction of the wafer area is sacrificed to be used as the dicing area. The dicing process can also be extremely time-consuming. In the present invention, die separation occurs by a simple dicing-free process, thus making dicing equipment redundant. This may be important in an industrial-scale operation, where the space freed up by the lack of dicing equipment can be used for other processing steps, thus potentially increasing the rate at which units are fabricated. In addition, the grid used to partition the dies can be made much thinner than the lanes used for scribing/dicing. The present method may therefore be more cost effective and material/process efficient.

Although certain embodiments of the invention have been described in detail, many variations are possible within the scope of the invention, as will be clear to a skilled reader.

The invention claimed is:

1. A method of fabricating semiconductor devices, the method comprising:
   providing a continuous device layer on a substrate, the continuous device layer comprising a semiconductor material;
   applying a patterning structure to the continuous device layer so that a first portion of the continuous device layer is masked and a second portion of the continuous device layer is unmasked;
   depositing a conductive material on the unmasked second portion of the continuous device layer to form a plurality of conductive substrates on the continuous device layer, each conductive substrate being in electrical contact with a respective portion of the continuous device layer;
   applying a temporary supporting carrier to the conductive substrates with a low-melting point adhesive or a solvent-soluble adhesive;
   affixing a mounting tape to the device layer;
   removing the temporary supporting carrier and adhesive so that the temporary supporting carrier and adhesive are not present in the fabricated semiconductor device;
   removing the patterning structure after depositing the conductive material; and
   stretching the mounting tape after removing the temporary substrate and after removing the patterning structure so that the continuous device layer is separated into a plurality of semiconductor devices, wherein the separation is substantially within the first portion of the continuous device layer.

2. A method according to claim 1, wherein the device layer comprises a plurality of islands of multilayer epitaxial regions, and wherein respective conductive substrates are formed on respective islands.

3. A method according to claim 2, further comprising, prior to depositing the conductive material, selectively removing portions of a multilayer epitaxial region to form the islands.

4. A method according to claim 1, wherein applying a patterning structure to the device layer comprises depositing a photoresist layer and irradiating portions of the photoresist layer to form a plurality of sidewalls of the patterning structure, the sidewalls being disposed within trenches between the islands.

5. A method according to claim 1, further comprising removing the substrate to expose a surface of the device layer.

6. A method according to claim 5, further comprising applying a metal contact layer to the exposed surface of the device layer, the metal contact layer comprising a plurality of metal contact elements in register with the plurality of conductive substrates.

7. A method according to claim 1, wherein the device layer is an LED layer comprising at least one multilayer epitaxial region, the or each multilayer epitaxial region comprising a p-type layer, an n-type layer and an active layer disposed between the p-type and n-type layers.

8. A method according to claim 7, wherein the semiconductor devices are vertical LEDs.

9. A method according to claim 1, wherein the separating is without dicing or scribing of the conductive material.

10. A method according to claim 2, wherein the islands have angled sidewalls.

11. A method according to claim 1, wherein the temporary supporting layer is soluble.

* * * * *